(12) United States Patent
Orzechowski et al.

(10) Patent No.: US 12,713,522 B2
(45) Date of Patent: Aug. 18, 2026

(54) FLEXIBLE PRINTED CIRCUIT BOARD

(71) Applicant: Lisa Dräxlmaier GmbH, Vilsbiburg (DE)

(72) Inventors: Sebastian Orzechowski, Orzesze (PL); Michal Krecichwost, Katowice (PL)

(73) Assignee: Lisa Dräxlmaier GmbH, Vilsbiburg (DE)

( * ) Notice: Subject to any disclaimer, the term of this patent is extended or adjusted under 35 U.S.C. 154(b) by 266 days.

(21) Appl. No.: 18/671,194

(22) Filed: May 22, 2024

(65) Prior Publication Data

US 2025/0247951 A1 Jul. 31, 2025

(30) Foreign Application Priority Data

Jan. 30, 2024 (DE) ........................ 202024100 443.4

(51) Int. Cl.
*H05K 1/02* (2006.01)
*H05K 1/11* (2006.01)
*H05K 1/189* (2026.01)
*H05K 3/28* (2006.01)

(52) U.S. Cl.
CPC ........... *H05K 1/0281* (2013.01); *H05K 1/111* (2013.01); *H05K 1/189* (2013.01); *H05K 3/281* (2013.01); *H05K 2201/035* (2013.01)

(58) Field of Classification Search
CPC ...... H05K 1/0281; H05K 1/111; H05K 1/189; H05K 3/281; H05K 2201/035
See application file for complete search history.

(56) References Cited

U.S. PATENT DOCUMENTS

| | | | | |
|---|---|---|---|---|
| 6,118,665 A * | 9/2000 | Kishida | H05K 3/361 | 361/776 |
| 6,169,253 B1 * | 1/2001 | Jairazbhoy | H05K 3/3442 | 361/767 |
| 2005/0139387 A1 * | 6/2005 | Nishi | H10W 70/65 | 257/E23.07 |
| 2009/0014204 A1 * | 1/2009 | Wang | H05K 1/118 | 174/254 |

* cited by examiner

*Primary Examiner* — Nathan Milakovich
(74) *Attorney, Agent, or Firm* — Burris Law, PLLC

(57) ABSTRACT

A flexible printed circuit board includes a flexible substrate layer on which a plurality of electrically conductive connections are arranged as conductive tracks and a flexible coverlay connected to the flexible substrate layer. The flexible coverlay covers the conductive tracks. The flexible coverlay has, in at least one solder area, a coverlay opening which exposes a plurality of spaced-apart component connection pads to receive a solder paste and which delimits the at least one solder area on a periphery, so that the plurality of spaced-apart component connection pads when provided with solder paste form a plurality of solder pads which adjoin, at least in part, an opening edge area of the coverlay opening to provide a solder stop. The opening edge area of the coverlay opening is, at least partially, non-linear and has a curve shape.

20 Claims, 4 Drawing Sheets

FLEXIBLE PRINTED CIRCUIT BOARD

CROSS-REFERENCE TO RELATED APPLICATIONS

This application claims priority to and the benefit of German Utility Model Application No. 20 2024 100 443.4 filed on Jan. 30, 2024. The disclosure of the above application is incorporated herein by reference.

FIELD

The present disclosure relates to a flexible printed circuit board and to a coverlay for a flexible printed circuit board.

BACKGROUND

The statements in this section merely provide background information related to the present disclosure and may not constitute prior art.

A typical printed circuit board comprises a substrate having a pattern of conductive tracks formed onto it. The substrate can either be rigid, as in a conventional printed circuit board (PCB), or flexible, as in a flexible printed circuit board (FPCB). Active and passive electrical and electronic components (hereinafter referred to generically as electronic components) are soldered onto the PCB via a number of PCB-side solder pads arranged around the edge of a component. Each solder pad thus forms a kind of termination of a conductive track, so to speak, which forms an input and output line to the component.

In a flexible printed circuit board manufacturing process, a flexible coverlay is used to encapsulate and protect the conductive tracks of a flexible printed circuit board. A flexible coverlay serves the same function as a solder mask that is used on a rigid printed circuit board. The difference with a flexible coverlay is the element of flexibility and durability it provides to a flexible printed circuit board design. There exist several options with regards to the coverlay, for example a polyimide coverlay comprising a layer of polyimide and a layer of adhesive.

FIGS. 1 to 4 show one example according to the prior art, according to which a flexible printed circuit board 100 has a flexible substrate layer 101 on which a plurality of electrically conductive connections are arranged as conductive tracks 102, in one example made of copper, in a defined pattern which is not shown in detail here (see FIGS. 1 and 3). As already described above, a flexible coverlay 103 is provided for covering the conductive tracks 102, which is firmly connected to the substrate layer 101, so that the conductive tracks 102 are arranged between the substrate layer 101 and the coverlay 103.

As shown in the example of FIG. 1, the coverlay 103 has a coverlay opening 105 in a solder area 104 which, according to the prior art, is rectangular with rounded corners. As can also be seen from FIG. 1, the coverlay opening 105 exposes a plurality of spaced-apart component connection pads 106 for the application of a solder paste, with the coverlay opening 105 bounding the solder area 104 on the periphery. If the component connection pads 106 are now provided with solder paste, as can be seen from the combined view of FIGS. 2 and 3, solder pads 107 are formed, which adjoin an opening edge area 108 of the coverlay opening 105, which acts as a solder stop, with a front partial area on the string side.

Electrical components, such as the electronic component 109 shown schematically in FIG. 2, are positioned with their connecting pins 110 on the solder pads 107 and subjected to a soldering process, for example in a soldering oven. During the soldering process, the solder melts in the solder paste and then forms solder connections between the connecting pins 110 of the electronic component 109 and the solder pads 107 on the printed circuit board 100. This provides both an electrical and a mechanical connection between the electronic component 109 and the printed circuit board 100.

As can be seen from the combined view of FIGS. 2 to 4, the front ends of the solder pads 107, which adjoin the opening edge area 108, all lie essentially on a horizontal line 111, i.e. in the transition area from solder paste to coverlay 103. In this transition area between the two materials symbolized by the line 111, stresses and strains acting horizontally and in opposite directions can occur, as shown in FIG. 4, if, for example, there are differences in the mechanical properties, thermal expansion, stiffness or other material parameters. For example, different strength and elongation properties of the materials can lead to stresses in the area of the line 111 when forces act on the printed circuit board 100. The same applies to temperature differences, as the materials have different thermal expansion coefficients. The stresses and strains in the area of the line 111, as shown schematically in FIG. 4, can lead to a break or crack along the line 111, which may adversely impact the flexible printed circuit board 100.

SUMMARY

This section provides a general summary of the disclosure and is not a comprehensive disclosure of its full scope or all of its features.

The present disclosure provides a flexible printed circuit board in which the risk of damage in the transition area between the solder pads and an associated opening edge area of a coverlay opening, which is caused by stresses and strains, may be reduced.

The present disclosure refers to a flexible printed circuit board which has a flexible substrate layer on which a plurality of electrically conductive connections are arranged as conductive tracks, in one example, made of copper and/or in a defined pattern. Furthermore, a flexible coverlay is provided, which is connected to the substrate layer for covering and/or masking the conductive tracks. This means that the conductive tracks are specifically arranged between the substrate layer and the coverlay or embedded between them. In at least one solder area, the coverlay has a coverlay opening which exposes a plurality of spaced-apart component connection pads for the application of a solder paste and which delimits the solder area on the periphery, so that the component connection pads provided with solder paste form solder pads, at least part of which adjoin an opening edge area of the coverlay opening which acts as a solder stop. The component connection pads are, in one example, suitable and designed to be electrically conductively connected to connecting pins of electronic components, as already described above.

According to the present disclosure, it is provided that the opening edge area of the coverlay opening acting as a solder stop is, at least partially, non-linear and has a curve shape or a curved design. With such a curve shape, the load in the transition area between the solder pads and an associated opening edge area of a coverlay opening is distributed over a larger area. In addition, the curve shape means that the forces acting in the transition area may partially cancel each other out if they act in opposite directions. In other words, the curve shape can be used to guide or distribute forces in the transition area between the solder pads and an associated opening edge area of a coverlay opening in different directions, so that the forces can cancel each other out to a certain extent or at least partially overlap. This is not only an advantage in the case of static loads on the flexible printed circuit board, but also in the case of dynamic loads on the flexible printed circuit board or vibrations acting on the flexible printed circuit board.

In one example of the present disclosure, the curve shape is formed at least on the side of the opening edge area of the coverlay opening that faces away from the (subsequently) mounted component and acts as a solder stop. This means that damage can be reliably reduced or avoided, particularly in this area that may be prone to cracking.

In principle, there are various ways of forming the curve shape. This also always depends on the specific geometry and alignment of the curve shape on the flexible printed circuit board. In one example, load peaks in the transition area between the solder pads and an associated opening edge area of a coverlay opening may be reduced or avoided if the curve shape of the opening edge area acting as a solder stop is at least partially symmetrical. Symmetrical curve shapes enable a substantially even distribution of forces on both sides of the transition area, which leads to a symmetrical load with the desired reduction in force and load.

According to one example, the curve shape is formed by a wave-like structure with at least one wave crest extending in the direction away from the coverlay opening and with at least one wave trough extending in the direction towards the coverlay opening. With such a wave-like structure, the loads in the transition area can be reduced or controlled while also avoiding force peaks. By arranging and positioning the wave crests and wave troughs, certain forces may be cancelled or reduced, thus reducing the load in the transition area.

Even if it would be sufficient in principle to provide one wave crest and one wave trough, according to one example, a load reduction in the transition area may occur if the wavelike structure has at least two wave crests with a wave trough located between the two wave crests. Alternatively or additionally, the same also applies to a wavelike structure which has at least two wave troughs with a wave crest located between the two wave troughs.

To avoid force peaks in the transition area, each wave crest and/or each wave trough has a rounded tip.

For a force profile in the transition area between the solder pads and an associated opening edge area of a coverlay opening, in one example, a rounded tip of a wave crest merges into a wave flank at a rounded end on the uphill side, which extends obliquely downwards and outwards from the tip of the wave crest to a wave trough adjoining the wave crest and which merges into the rounded tip of the wave trough at a rounded end on the downhill side. In the sense of a kinematic reversal, this naturally also applies if a rounded tip of a wave trough merges into a wave flank at a rounded end on the downhill side, which extends from the tip of the wave trough diagonally upwards and outwards to a wave crest adjoining the wave trough and which merges into the tip of the wave crest at a rounded end on the uphill side. In one example of the present disclosure, the rounded tip of the wave crest merges smoothly into the wave flank at the rounded end on the uphill side and/or that the wave flank merges smoothly into the rounded tip of the wave trough at the rounded end on the downhill side. Such a smooth transition from the rounded tip to an obliquely orientated wave flank here means a transition with a continuous, non-abrupt change in shape, i.e. specifically a transition without sharp corners and edges. This transition is thus characterised by a gentle, continuous connection between the rounded end of a rounded tip and the inclined wave flank. Such a transition also helps to reduce or eliminate potential stress points and force peaks.

The inclined wave flank between the rounded end on the uphill side and the rounded end on the downhill side may in principle also have a curve shape or a wave shape, and in one example, runs in a straight line. Both designs are suitable for reducing the loads in the desired manner, whereby this is simple and technically controllable in conjunction with a straight wave flank.

According to one example, the present disclosure provides that the wavelike structure has wave crests which, viewed individually or in groups, extend at least partially to different distances in the direction away from the coverlay opening (or away from the electrical component to be arranged later) in relation to their tip. This measure is a simple way of providing that not all wave crests lie on a common horizontal line, even if this is possible in principle. This further provides an even distribution of forces on both sides of the transition area with reduced loads on the transition area.

According to one example, the latter can be achieved, for example, by the wavelike structure having a first group of at least two wave crests whose wave crests all extend the same distance away from the coverlay opening, the wave crests of the first group of wave crests extending further in the direction away from the coverlay opening than at least one further wave crest. In one example, the wave crests of the first group of wave crests extend further in the direction away from the coverlay opening than the wave crests of a second group of at least two wave crests, the wave crests of which also all extend the same distance away from the coverlay opening. As already explained, this is only one possible concrete example. Of course, there are various ways in which such a pattern can be designed, for example as a pattern in the form ABBA, ABABAB, ABCABC or ABBCCBBA, to name just a few possible examples, in which the letters A, B and C each stand for tips of wave crests extending at different distances from the coverlay opening.

In one example, an offset area is provided whose front boundary is closer in the direction of the coverlay opening than its rear boundary, with the tips of all the wave crests always lying within the offset area. With such an arrangement and distribution of the tips of the wave crests in the offset area, excessively large distances between the tips of the wave crests may be reduced or avoided, so that there is no undesirable formation of geometries favouring force peaks in the area adjacent to the opening edge area of the coverlay opening, which acts as a solder stop.

The statements just made in connection with the wave crests can also apply to the wave troughs in the same way. In this respect, what has been said about the wave crests applies analogously to the wave troughs of the wavelike structure. And in this respect, the wavelike structure may have wave troughs which, in relation to their tip, extend individually or in groups, equally far or differently far in the direction away from the coverlay opening.

The actual extent and position of the wave crests and/or wave troughs also depends on where and how the solder pads are formed. Thus, according to one example, the present disclosure provides that the solder pads are formed at least in the region of the wave crests, and in one example, are formed in such a way that the at least one wave trough is located in the region between two solder pads. In one example, in connection with several wave troughs, the present disclosure provides that their tips all lie on a horizontal line, since no solder pads are adjacent to the tips of the wave troughs. In principle, however, it is of course possible to design the solder pads in such a way that they extend not only in the area of the wave crests, but also, at least partially, in the area of the wave troughs. In one example, in the sense of a kinematic reversal, the solder pads are formed at least in the area of the wave troughs, and in one example, are formed in such a way that the at least one wave crest is located in the area between two solder pads. In this case, in connection with several wave crests, it could then also be provided that their tips all lie on a horizontal line, since no solder pads are adjacent to the tips of the wave crests, while the tips of the wave troughs may then, in one example, be arranged individually or in groups offset to one another.

In addition, according to one example, the wavelength as distance between two wave crests and/or wave troughs is the same or the wavelength as distance between two wave crests and/or wave troughs, seen individually or in groups, varies. This also allows improved adaptation to the specific standards in each case and thus provides the desired reduction in stress and tension in the transition area between the solder pads and the opening edge area of the coverlay opening, which acts as a solder stop. The coverlay may be a top layer.

The present disclosure provides a coverlay for covering and/or masking of a flexible printed circuit board, which has a coverlay opening which is suitable and designed, in an assembled state in which the coverlay is arranged on a flexible substrate layer of a printed circuit board, to expose a plurality of component connection pads spaced apart from one another for the application of a solder paste and to delimit the solder area on the periphery, so that the component connection pads provided with solder paste form solder pads which adjoin, at least in part, an opening edge area of the coverlay opening acting as a solder stop. According to the present disclosure, it is provided that the opening edge area of the coverlay opening acting as a solder stop is, at least partially, non-linear and has a curve shape.

The advantages resulting from said coverlay are identically to those of the flexible printed circuit board and thus apply here in an analogous manner. In this respect, reference is made to the explanations given previously in order to avoid repetition.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figures 1, 2:
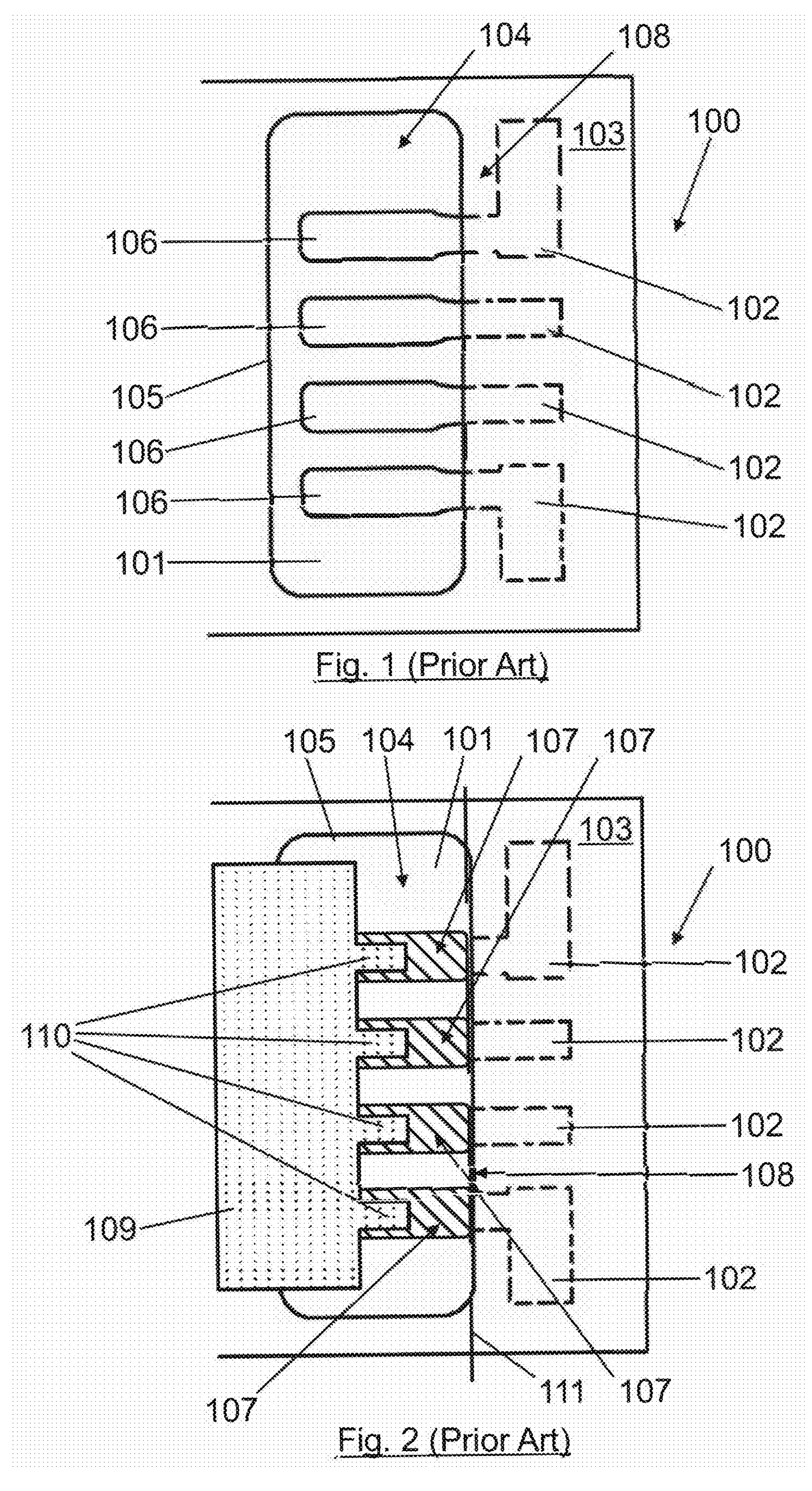
FIG. 1 is a schematic top view of a flexible printed circuit board according to prior art, with a substrate layer and a coverlay having a coverlay opening that exposes several spaced-apart component connection pads for applying a solder paste.
FIG. 2 is a schematic top view of prior art corresponding to FIG. 1, in which the component connection pads provided with solder paste form solder pads, which in turn are provided with connecting pins of an electronic component.
Figures 3, 4:
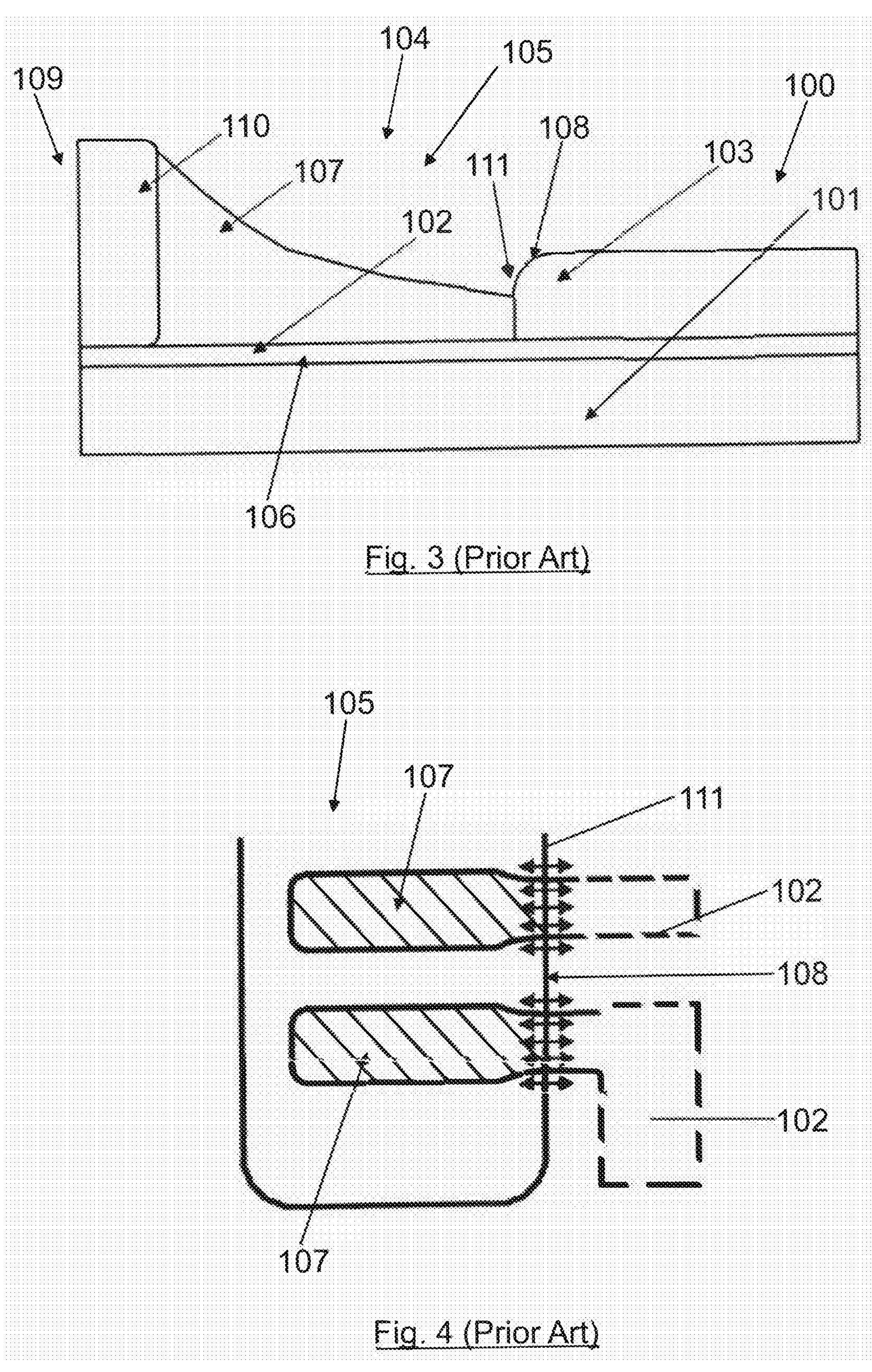
FIG. 3 is a schematic cross-sectional view of the prior art structure shown in FIG. 2.
FIG. 4 is a schematic top view of an enlarged detailed representation of the stress and load situation in the transition area from solder pads to an opening edge area acting as a solder stop in accordance with the prior art shown in FIG. 2.
Figures 5, 6:
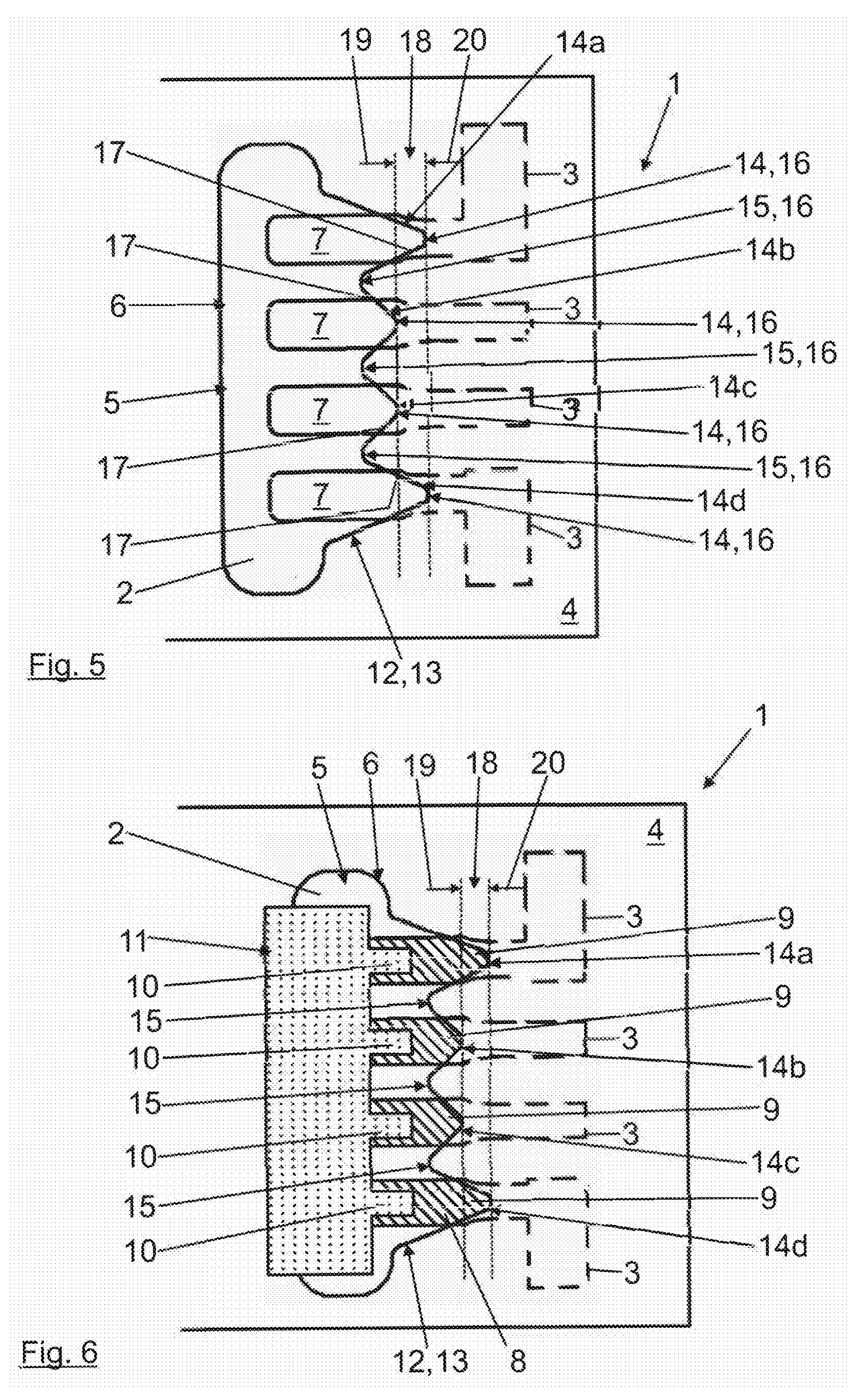
FIG. 5 is a schematic top view of a flexible printed circuit board with a substrate layer, with conductive tracks attached to the substrate layer and with a coverlay having a coverlay opening which exposes a plurality of spaced-apart component connection pads for the application of a solder paste according to one example of the present disclosure.
Figure 7:
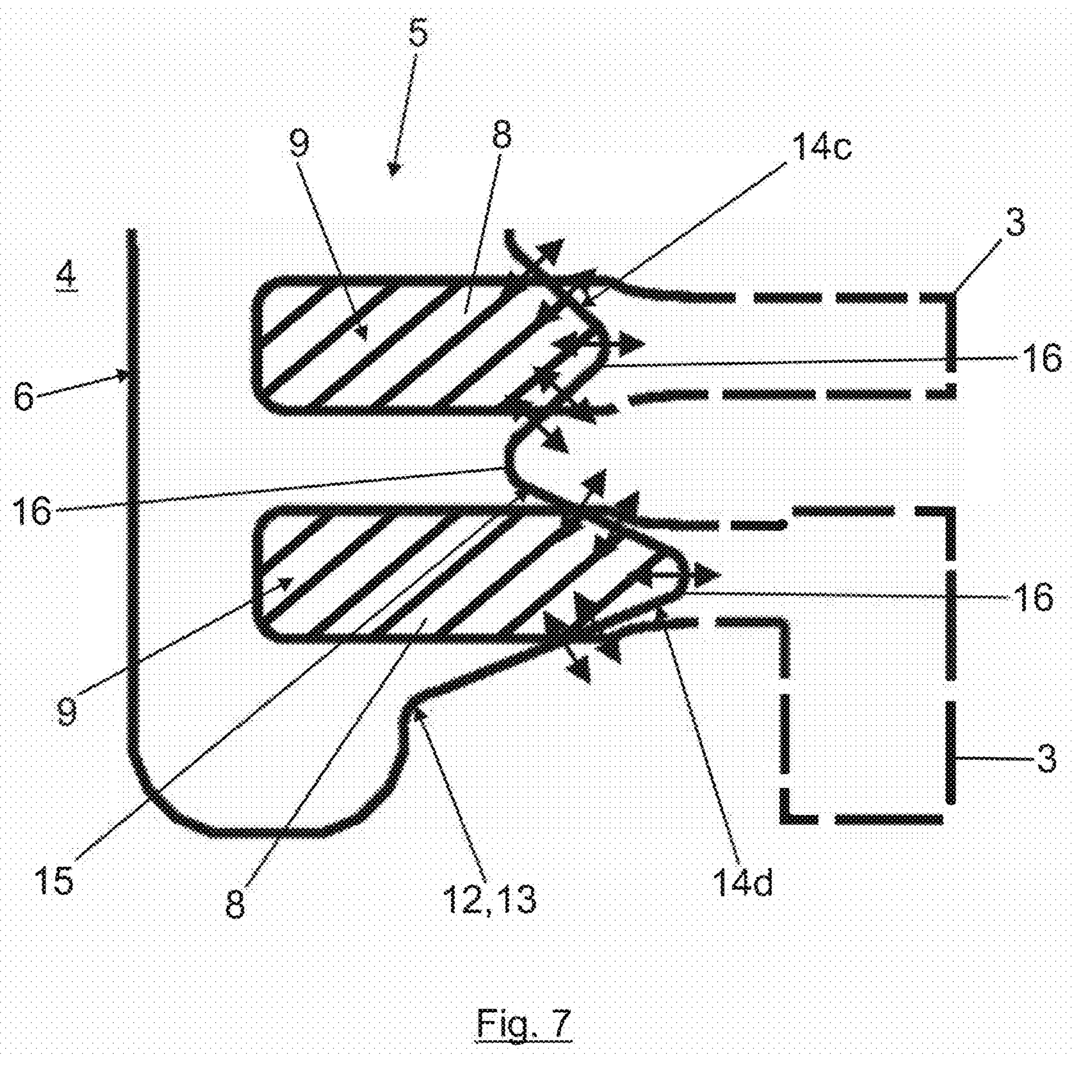

FIG. 6 is a schematic top view of one example according to the present disclosure, in which the component connection pads provided with solder paste form solder pads, which in turn are provided with connecting pins of an electronic component; and FIG. 7 is a schematic top view of an enlarged detailed representation of the stress and load situation in the transition area from solder pads to an opening edge area acting as a solder stop according to the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

FIGS. 5 to 7 show an example of the present disclosure, in which a flexible printed circuit board 1 has a flexible substrate layer 2 on which a plurality of electrically conductive connections are arranged as conductive tracks 3. The conductive tracks 3 in one example, are made of copper and/or in a defined pattern that is not shown in detail here. A flexible coverlay 4 is provided to cover and mask the conductive tracks 3, which is firmly connected to the substrate layer 2, so that the conductive tracks 3 are arranged between the substrate layer 2 and the coverlay 4.

The coverlay 4 has a coverlay opening 6 in a solder area 5, which exposes several spaced-apart component connection pads 7 configured to receive a solder paste 8, whereby the coverlay opening 6 delimits the solder area 5 on the periphery.

If the component connection pads 7 are now provided with solder paste 8, as can be seen in FIG. 6, solder pads 9 are formed, on which connecting pins 10 of an electronic component 11 can then be positioned and subjected to a soldering process in order to establish solder connections between the connecting pins 10 and the solder pads 9 on the printed circuit board 1. This forms both an electrical and a mechanical connection between the electronic component 11 and the printed circuit board 1. In one example, the electronic component 11 is a mounted component.

As can also be seen from the combination of FIGS. 5 and 6, the solder pads 9 on the side facing away from the electronic component 11 adjoin an opening edge area 12 of the coverlay opening 6, which acts as a solder stop, is non-linear here and has a curve shape, wherein the curve shape is formed here, by way of example, by a wave-like structure 13, which in turn has here, by way of example only, a plurality of wave crests 14 extending in the direction away from the coverlay opening 6 and a plurality of wave troughs 15 extending in the direction towards the coverlay opening 6. In one example, the curve shape is at least partially symmetrical.

Each wave crest 14 and each wave trough 15 has a rounded tip 16, each rounded tip 16 of a wave crest 14 merging at a rounded end on the uphill side into a wave flank 17 which, starting from the tip 16 of the wave crest 14, extends obliquely downwards and outwards to a wave trough 15 adjoining the wave crest 14 and which, at a rounded end on the downhill side, merges into the rounded tip 16 of the wave trough 15.

As can be seen from FIGS. 5 and 6, the rounded tip 16 of the wave crest 14 merges smoothly into the wave flank 17 at the rounding end on the uphill side and the wave flank 17 merges smoothly into the rounded tip 16 of the wave trough 15 at the rounding end on the downhill side, with the wave flank 17 running in a straight line between the rounding end on the uphill side and the rounding end on the downhill side.

In one example shown in FIGS. 5 to 7, the solder pads 9 are only formed in the area, or region, of the wave crests 14, while the wave troughs 15 are each located in the area, or region, between two solder pads 9. In another example, the solder pads 9 are formed in a region of the wave troughs 15, in such a way that the wave crests 14 lie in a region between two solder pads 9. In one example, at least some of the wave crests 14, here exemplified by the two outer wave crests 14*a* and 14*d*, extend further in the direction away from the coverlay opening 6 or the electronic component 11 than other wave crests, here exemplified by the two inner wave crests 14*b*, 14*c*, shown in relation to their rounded tip 16. As already explained, this is only one possible example. Of course, other examples are also possible in which the wave crests 14, viewed individually and/or in groups, extend at different distances from the coverlay opening 6 or the electronic component 11.

As also shown in FIGS. 5 and 6, an offset area 18 is provided, with a front boundary 19 that lies closer to the coverlay opening 6 than a rear boundary 20 of the offset area 18, whereby the tips 16 of all wave crests 14 lie within the offset area 18.

As shown in FIG. 6, the curved opening edge area 12 of the coverlay opening 6 provides that not all wave crests 14 and thus the front ends of the solder pads 9 lie on a common horizontal line, as represented for example by the front boundary 19 or the rear boundary 20 of the offset area 18. This makes it possible, as shown only schematically and enlarged in FIG. 7, to reduce the stresses and strains in the transition area between the solder pads 9 and the opening edge area 12, since the stress is distributed over a larger area and the curve shape, represented here by the wavelike structure 3, further results in that the forces which act in the transition area between the solder pads 9 and the opening edge area 12 of the coverlay opening 6 cancel each other, at least partially, out. As a result, damage and otherwise adverse impacts to this transition area may be reduced or avoided.

The remarks made in connection with the wave crests 14 with regard to their different extension away from the coverlay opening 6 or with regard to their offset could in principle apply analogously to the wave troughs 15, for example, if the solder pads 9 also extend into the areas of the wave troughs 15. However, since in the example shown in FIGS. 5 to 7 the rounded tips 16 of the wave troughs 15 are each located in solder paste free areas between the individual solder pads 9, the specific design and arrangement of the wave troughs 15 only plays a subordinate role here, so that these can also lie on a common horizontal line, as shown by way of example in FIGS. 5 to 7. In one example, the wave troughs 15, with respect to each tip 16 of the wave trough 15, extends, individually or in groups, for an equal distance in the direction away from the coverlay opening 6. In another example, the wave troughs 15, with respect to each tip 16 of the wave trough 15, extends, individually or in groups, for varied distances in the direction away from the coverlay opening 6.

As also shown in FIGS. 5 to 7, the wavelength as the distance between two wave crests 14 is the same in the example shown, but could theoretically also vary.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A flexible printed circuit board, comprising:

a flexible substrate layer on which a plurality of electrically conductive connections are arranged as conductive tracks; and a flexible coverlay coupled to the flexible substrate layer to at least partially cover the conductive tracks, the flexible coverlay including, in at least one solder area, a coverlay opening that exposes a plurality of spaced-apart component connection pads configured to receive a solder paste and delimits the at least one solder area on a periphery so that the plurality of spaced-apart component connection pads when provided with solder paste form a plurality of solder pads which adjoin, at least in part, an opening edge area of the coverlay opening to provide a solder stop, and the opening edge area of the coverlay opening is, at least partially, non-linear and has a curve shape.

2. The flexible printed circuit board according to claim 1, wherein the curve shape is formed at least on a side of the opening edge area of the coverlay opening that faces away from a mounted component and the curve shape is at least partially symmetrical.

3. The flexible printed circuit board according to claim 1, wherein the curve shape is formed by a wave-like structure with a wave crest extending in a first direction away from the coverlay opening and with a wave trough extending in a second direction towards the coverlay opening.

4. The flexible printed circuit board according to claim 3, wherein the wave trough has a rounded tip.

5. The flexible printed circuit board according to claim 4, wherein the wave crest has a rounded tip.

6. The flexible printed circuit board according to claim 5, wherein the rounded tip of the wave crest merges at a rounded end on an uphill side into a wave flank which, starting from the rounded tip of the wave crest, extends obliquely downwards and outwards to the wave trough adjoining the wave crest and which merges at a rounded end on a downhill side into the rounded tip of a second wave trough.

7. The flexible printed circuit board according to claim 6, wherein the rounded tip of the wave crest merges smoothly into the wave flank at the rounded end on the uphill side.

8. The flexible printed circuit board according to claim 6, wherein the wave flank merges smoothly into the rounded tip of the second wave trough at the rounded end on the downhill side.

9. The flexible printed circuit board according to claim 6, wherein the wave flank runs in a straight line between the rounded end on the uphill side and the rounded end on the downhill side.

10. The flexible printed circuit board according to claim 1, wherein the curve shape is formed by a wave-like structure that comprises at least two wave crests with a wave trough located between the at least two wave crests.

11. The flexible printed circuit board according to claim 10, wherein the at least two wave crests extend at least partially to different distances in a first direction away from the coverlay opening in relation to each tip of the at least two wave crests.

12. The flexible printed circuit board according to claim 10, wherein an offset area is provided, a front boundary of the offset area lies closer to the coverlay opening than a rear boundary of the offset area, and each tip of the at least two wave crests lie within the offset area.

13. The flexible printed circuit board according to claim 10, wherein the plurality of solder pads are formed at least in a region of the at least two wave crests such that the wave trough lies in the region between two solder pads of the plurality of solder pads.

14. The flexible printed circuit board according to claim 10, wherein the wave-like structure further includes a second wave trough, and a distance between two wave crests of the at least two wave crests and a second distance between the wave trough and the second wave trough are equal.

15. The flexible printed circuit board according to claim 10, wherein the wave-like structure further includes a second wave trough, and a distance between two wave crests of the at least two wave crests and a second distance between the wave trough and the second wave trough varies.

16. The flexible printed circuit board according to claim 1, wherein the curve shape is formed by a wave-like structure that comprises at least two wave troughs with a wave crest located between the at least two wave troughs.

17. The flexible printed circuit board according to claim 16, wherein the at least two wave troughs which, with respect to each tip of the at least two wave troughs, extend for an equal distance in a first direction away from the coverlay opening.

18. The flexible printed circuit board according to claim 16, wherein the at least two wave troughs which, with respect to each tip of the at least two wave troughs, extend for varied distances in a first direction away from the coverlay opening.

19. The flexible printed circuit board according to claim 16, wherein the plurality of solder pads are formed at least in a region of the at least two wave troughs, in such a way that the wave crest lies in a region between two solder pads of the plurality of solder pads.

20. A coverlay for covering of a flexible printed circuit board, comprising:

a coverlay opening which, in an assembled state in which the coverlay is arranged on a flexible substrate layer of a printed circuit board, is configured to expose a plurality of spaced-apart component connection pads configured to receive a solder paste and to delimit a solder area on a periphery of the coverlay opening, so that the plurality of spaced-apart component connection pads when provided with solder paste form a plurality of solder pads which adjoin, at least in part, an opening edge area of the coverlay opening to provide a solder stop, and the opening edge area of the coverlay opening is, at least partially, non-linear and has a curve shape.

* * * * *